United States Patent
Jang et al.

(10) Patent No.: US 9,147,864 B2
(45) Date of Patent: Sep. 29, 2015

(54) PROTECTIVE CIRCUIT MODULE AND SECONDARY BATTERY INCLUDING THE SAME

(75) Inventors: Youngcheol Jang, Yongin-si (KR); Eunok Kwak, Yongin-si (KR); Kyungwon Seo, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 954 days.

(21) Appl. No.: 12/629,284

(22) Filed: Dec. 2, 2009

(65) Prior Publication Data

US 2010/0136374 A1 Jun. 3, 2010

(30) Foreign Application Priority Data

Dec. 2, 2008 (KR) .................. 10-2008-0121517

(51) Int. Cl.
| | |
|---|---|
| *H01M 14/00* | (2006.01) |
| *H01M 2/04* | (2006.01) |
| *H01M 2/10* | (2006.01) |
| *H01M 10/42* | (2006.01) |
| *H01M 2/02* | (2006.01) |
| *H05K 1/18* | (2006.01) |

(52) U.S. Cl.
CPC .......... *H01M 2/0404* (2013.01); *H01M 2/1055* (2013.01); *H01M 10/425* (2013.01); *H01M 2/022* (2013.01); *H05K 1/189* (2013.01)

(58) Field of Classification Search
CPC ............ H01M 2/0404; H01M 10/425; H01M 2/1055; H01M 2/022; H05K 1/189
See application file for complete search history.

(56) References Cited

U.S. PATENT DOCUMENTS

| | | | |
|---|---|---|---|
| 2002/0001745 A1* | 1/2002 | Gartstein et al. ................ | 429/61 |
| 2004/0115519 A1 | 6/2004 | Lee | |
| 2008/0160392 A1* | 7/2008 | Toya et al. ...................... | 429/90 |

FOREIGN PATENT DOCUMENTS

| | | |
|---|---|---|
| JP | 2008-181855 | 8/2008 |
| KR | 10-2002-0070653 A | 9/2002 |
| KR | 10-2006-0112728 A | 11/2006 |

* cited by examiner

*Primary Examiner* — Gary Harris
(74) *Attorney, Agent, or Firm* — Knobbe, Martens, Olson & Bear LLP (57) ABSTRACT

A protective circuit module and a secondary battery including the same. The secondary battery includes: an electrode assembly, a can to house the electrode assembly, and a cap assembly to seal an opening of the can. The protective circuit module includes: a first module electrically connected to the cap assembly; a second module electrically connected to a closed end of the can; and a third module electrically connecting the first module and the second module. The first module includes a mounting portion that is disposed in a groove between the can and the cap assembly.

14 Claims, 9 Drawing Sheets

PROTECTIVE CIRCUIT MODULE AND SECONDARY BATTERY INCLUDING THE SAME

CROSS-REFERENCE TO RELATED APPLICATION

This application claims the benefit of Korean Application No. 10-2008-0121517, filed Dec. 2, 2008, in the Korean Intellectual Property Office, the disclosure of which is incorporated herein by reference.

BACKGROUND OF THE INVENTION

1. Field of the Invention

Aspects of the present invention relate to a protective circuit module and a secondary battery including the same.

2. Description of the Related Art

A lithium ion secondary battery generally includes a bare cell, a protective circuit module connected to the bare cell, and a case to cover the bare cell and the protective circuit module. In recent years, much research has focused on miniaturizing secondary batteries, while maintaining the functionality thereof.

SUMMARY OF THE INVENTION

Aspects of the present invention provide a simplified and miniaturized protective circuit module, and a secondary battery including the same.

In accordance with an exemplary embodiment of the present invention, there is provided a secondary battery comprising a bare cell and a protective circuit module electrically connected to the bare cell. The protective circuit module includes: a disk-shaped first module electrically connected to a first electrode terminal of the bare cell; a disk-shaped second module electrically connected to a second electrode terminal of the bare cell; and a third module electrically connecting the first module and the second module.

According to aspects of the present invention, the first module may include: a first board; a first plate disposed on a central portion of an inner surface of the first board, which faces the first electrode terminal; and a mounting portion disposed adjacent to an outer edge of the inner surface of the first board.

According to aspects of the present invention, the mounting portion may be located in a groove formed between the first electrode terminal and a can of the bare cell. The mounting portion may be ring-shaped. A hole corresponding to the first plate may be formed in the first board.

According to aspects of the present invention, the second module may include: a second board; and a second plate located on an inner surface of the second board, which faces the second electrode terminal. A hole corresponding to the second plate may be formed in the second board.

According to aspects of the present invention, the first electrode terminal and the second electrode terminal may be welded to the first plate and the second plate, respectively. The first board, the second board, and the third module may be flexible printed circuit boards (FPCBs).

According to aspects of the present invention, a label may surround the outer surface of the bare cell, and a top cap and a bottom cap may cover outer surfaces of the first module and the second module, respectively.

In accordance with another aspect of the present invention, there is provided a protective circuit module electrically connected to a bare cell, the protective circuit module comprising: a disk-shaped first module electrically connected to a first electrode terminal of the bare cell; a disk-shaped second module electrically connected to a second electrode terminal of the bare cell; and a third module electrically connecting the first module and the second module.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the present invention will become apparent and more readily appreciated from the following description of the exemplary embodiments, taken in conjunction with the accompanying drawings, of which.

DETAILED DESCRIPTION OF THE EXEMPLARY EMBODIMENTS

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

As referred to herein, when a first element is said to be disposed or formed "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

Figure 1:
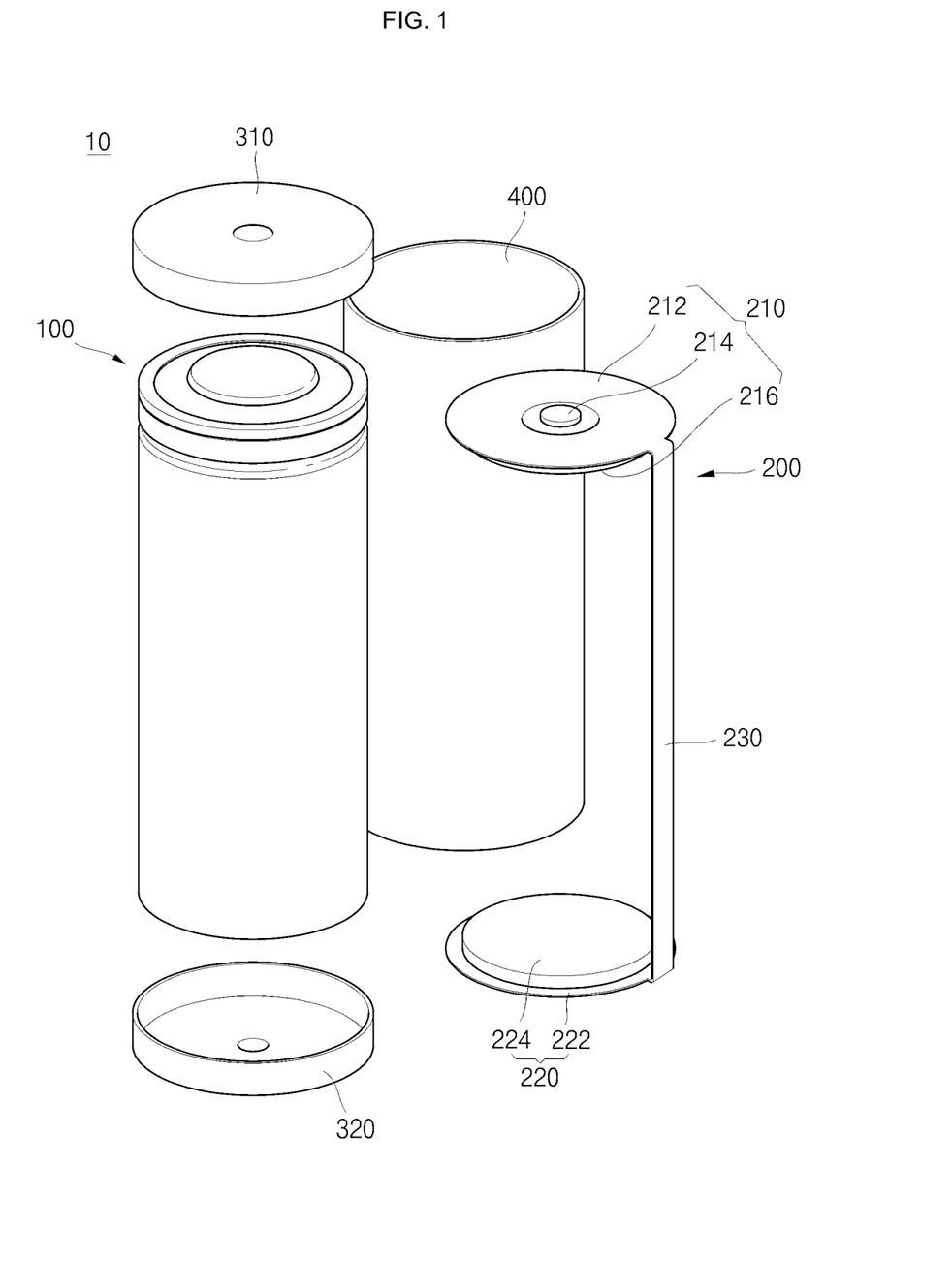
FIG. 1 is an exploded perspective view of a secondary battery, according to an exemplary embodiment of the present invention.

FIG. 1 is an exploded perspective view of a secondary battery 10, according to an exemplary embodiment of the present invention. Referring to FIG. 1, the secondary battery 10 includes a bare cell 100, a protective circuit module 200, a top cap 310, a bottom cap 320, and a label 400.

The protective circuit module 200 is disposed on the bare cell and includes a first module 210, a second module 220, and a third module 230 to electrically connect the first and second modules 210, 220. The top cap 310 and the bottom cap 320 cover the outer surfaces of the first module 210 and the second module 220, respectively. The bare cell 100 is wrapped and protected by the label 400.

Figure 2:
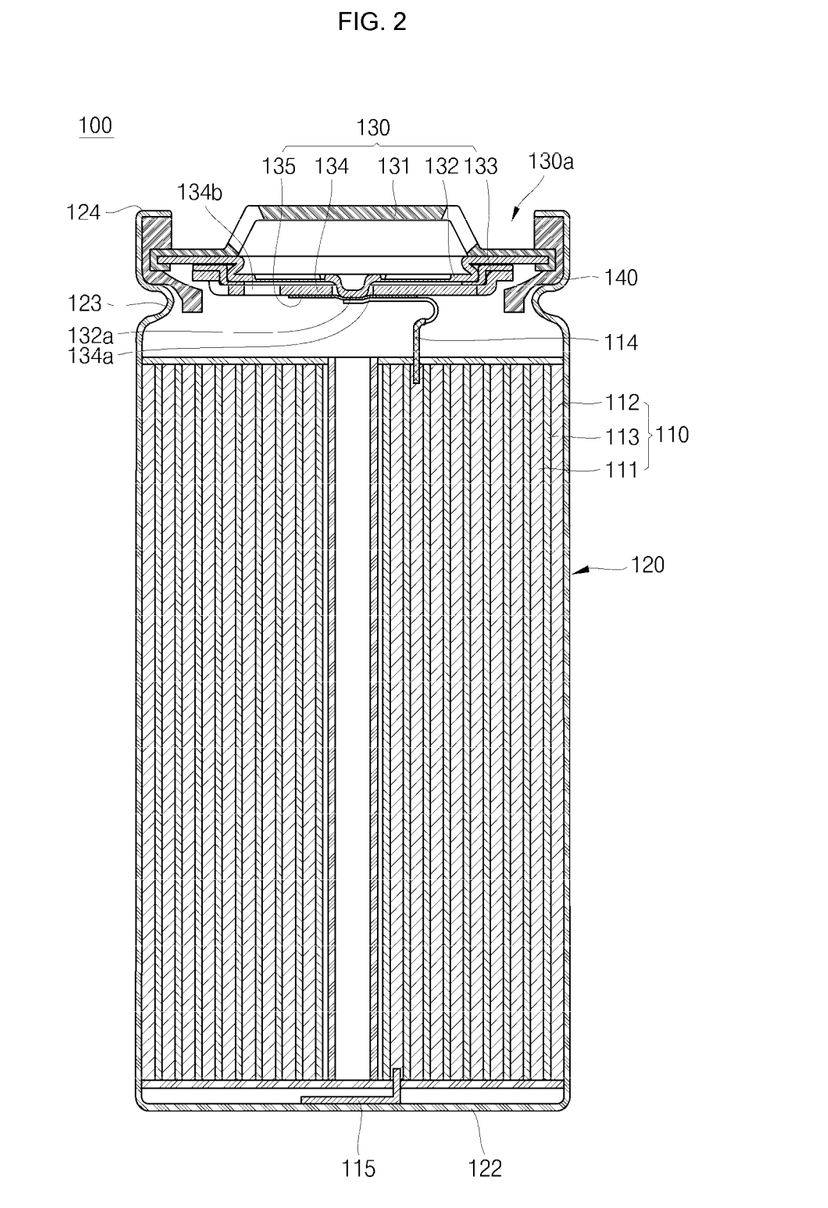
FIG. 2 is a sectional view of a bare cell of the secondary battery of FIG. 1.

FIG. 2 is a sectional view of the bare cell 100. Referring to FIG. 2, the bare cell 100 includes an electrode assembly 110, a can 120 to house the electrode assembly 110, and a cap assembly 130 to seal an opening of the can 120.

The can 120 is generally cylindrical and made of a metal. The can 120 can operate as a terminal. The electrode assembly 110 is inserted through an open end 101 of the can 120. A beading portion 123 is formed to secure the electrode assembly 110 in the can 120. A crimping portion 124 is formed at the open end of the can 120, to secure the cap assembly 130. Here, the can 120 may operate as a negative electrode terminal or a positive electrode terminal. A bottom end 122 of the can 120 may be electrically connected to the electrode assembly 110.

The electrode assembly 110 includes a first electrode plate 111, a second electrode plate 112, and a separator 113. The electrode assembly 110 is wound in a jelly-roll configuration, in which the separator 113 is located between the first electrode plate 111 and the second electrode plate 112.

The first electrode plate 111 includes a first electrode collector (not shown) and a first electrode coating portion (not shown). When the first electrode plate 111 is a positive electrode plate, the first electrode collector may be formed of a highly-conductive aluminum foil, or the like.

The first electrode coating portion is located on the first electrode collector, and may include a first electrode active material, a conductive material, and a binder. Here, the first electrode active material may be lithium cobalt oxide ($LiCoO_2$), lithium manganese oxide ($LiMn_2O_4$), or lithium nickel oxide ($LiNiO_2$), for example. Carbon black may be used as the conductive material. The binder may be formed by dissolving and dispersing PVDF, SBR, or PTFE, with a volatile solvent such as NMP, an organic solvent, or water.

The first electrode collector includes first electrode non-coating portions (not shown), where the first electrode coating portion is not formed, at opposite ends thereof. A first electrode tab 114 is attached to the first electrode non-coating portion, such that it protrudes toward the open end 101 of the can 100. The first electrode tab 114 may be made of aluminum, for example.

The second electrode plate 112 includes a second electrode collector (not shown) and a second electrode coating portion (not shown). When the second electrode plate 112 is a negative electrode plate, the second electrode collector may be formed of a highly-conductive copper foil.

The second electrode coating portion is located on the second electrode collector, and may include a second electrode active material, a conductive material, and a binder. Here, the second electrode active material may be a carbon material, Si, Sn, a tin oxide, a composite tin alloy, a transition metal oxide, a lithium metal nitride, or a lithium metal oxide, for example. A carbon material is mainly used as the second electrode active material. Carbon black is used as the conductive material. The binder may be formed by dissolving and dispersing PVDF, SBR, or PTFE, with a volatile solvent such as NMP, an organic solvent, or water. The second electrode plate 220 need not be a conductive material, because the conductivity of the second electrode coating material itself is high.

The second electrode collector includes second electrode non-coating portions (not shown), where the first electrode coating portion is not formed, at opposite ends thereof. The second electrode tab 115 is attached to the second electrode non-coating portion and is connected to the bottom end 122 of the can 120. The second electrode tab 115 may be made of copper (Cu) and/or nickel (Ni).

The separator 113 is a porous membrane formed using polyethylene (PE), polypropylene (PP), or a composite film thereof. The separator 113 electrically insulates the first electrode plate 111 and the second electrode plate 112 and is permeable to lithium ions. The separator 113 prevents the first electrode plate 111 and the second electrode plate 112 from making contact with each other. The separator 113 shuts down the secondary battery 10, when the temperature of the secondary battery 10 is too high, due to a short circuit, or the like.

During a charge operation of the secondary battery 10, lithium ions are transferred from the first electrode plate 111 and intercalated into the second electrode plate 112. On the other hand, during a discharge operation of the secondary battery 10, lithium ions are deintercalated from the secondary electrode plate 112 and intercalated into the first electrode plate 111, to apply a voltage to an external device.

The cap assembly 130 is electrically connected to the electrode assembly 110. The cap assembly 130 includes: a cap-up 131 to transfer current generated in the electrode assembly 110, to the outside; a safety vent 132 attached to the bottom surface of the cap-up 131, to interrupt current when an abnormal pressure is generated inside the can 120 and to discharge internal gas; a cap-down 134 installed under the safety vent 132, to seal the interior of the can 120; an insulator 133 installed between the safety vent 132 and the cap-down 134; and a sub-plate 135 fixed to the bottom surface of the cap-down 134. The first electrode tab 114 is attached to the cap-down 134.

The cap-up 131 is generally cylindrical, and a central portion of the cap-up 131 protrudes, so as to be electrically connected to the protective circuit module 200. The cap-up 131 may be referred to as a first electrode terminal.

The safety vent 132 is generally cylindrical and corresponds to the cap-up 131. The safety vent 132 has a protrusion 132a that protrudes downward, at a central portion thereof. The cap-up 131 and the safety vent 132 are assembled before the other parts of the cap assembly 130 are assembled.

The assembled cap-up 131 and safety vent 132 are positioned on the inner peripheral surface of a gasket 140, which is installed at an open end of the can 120, and is attached to the outer edge of the cap-up 131. The insulator 133 is interposed between the safety vent 132 and the cap-down 134, to insulate the safety vent 132 and the cap-down 134.

The cap-down 134 is generally cylindrical. The cap-down 134 includes a central through-hole 134a, through which the protrusion 132a of the safety vent 132 passes. A gas discharge hole 134b may be formed on one side of the cap-down 134, to discharge the gas generated by the electrode assembly 110.

The sub-plate 135 is welded to the protrusion 132a of the safety vent 132, via the central through-hole 134a, to electrically connect the first electrode tab 114 and the safety vent 132. Although not illustrated in the drawings, a secondary protective device, i.e., a PTC device, may be installed between the cap-up 131 and the safety vent 132.

Figure 3:
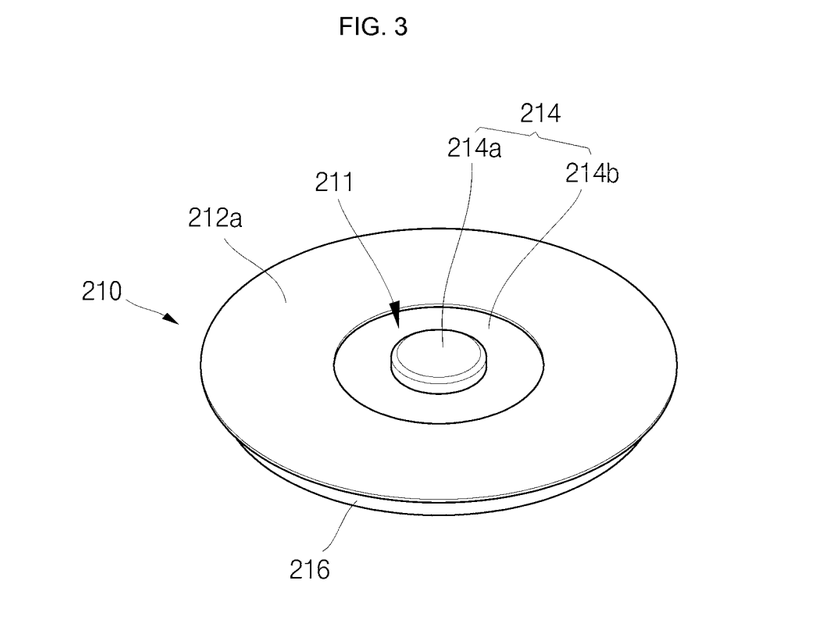
FIGS. 3 and 4 are perspective views of a first module of the secondary battery of FIG. 1.
Figure 4:
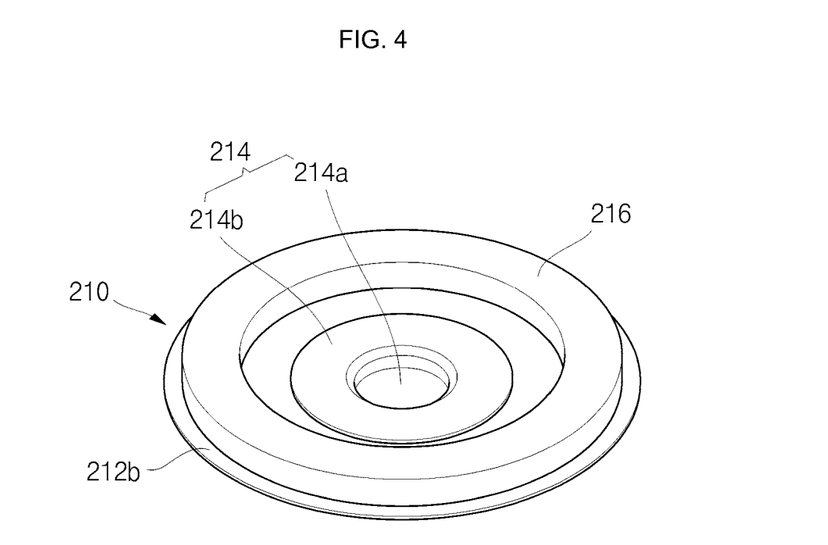

FIGS. 3 and 4 are perspective views of the first module 210. Referring to FIGS. 1, 3, and 4, the protective circuit module 200 includes the first module 210, the second module 220, and the third module 230.

The first module 210 is located on the top surface of the bare cell 100, and includes a first board 212, a first plate 214, and a mounting portion 216. The first board 212 is disk-shaped, and may be a flexible printed circuit board (FPCB). A plurality of printed circuit patterns (not shown) may be connected to the first plate 214 and the mounting portion 216. A circular hole 211 is formed at a central portion of the first board 212. The first board 212 has an inner surface 212b that faces the first electrode terminal (cap-up 131) and an outer surface 212a that faces the top cap 310.

The first plate 214 is located on a central portion of the inner surface 212b of the first board 212. The first plate 214 includes a protrusion 214a that protrudes through the hole 211 of the first board 212, and a flat portion 214b that is soldered to the inner surface 212b of the first board 212. The first electrode terminal (cap-up 131) is welded to the flat portion 214b of the first plate 214.

The mounting portion 216 is located around the periphery of the inner surface 121b of the first board 212 and is generally ring-shaped. In other words, the mounting portion 216 is spaced apart from, and surrounds, the first plate 214. In the mounting portion 216, passive and active devices, including a protective circuit, are electrically connected to conductive metal patterns. The protective circuit checks information, including the charge/discharge state, current, voltage, and/or temperature of the bare cell 100, to protect the bare cell 100. When the protective circuit module 200 is connected to the bare cell 100, the mounting portion 216 is located in a groove 130a (see FIG. 2) formed between the first electrode terminal (cap-up 131) and the can 120.

Figure 5:
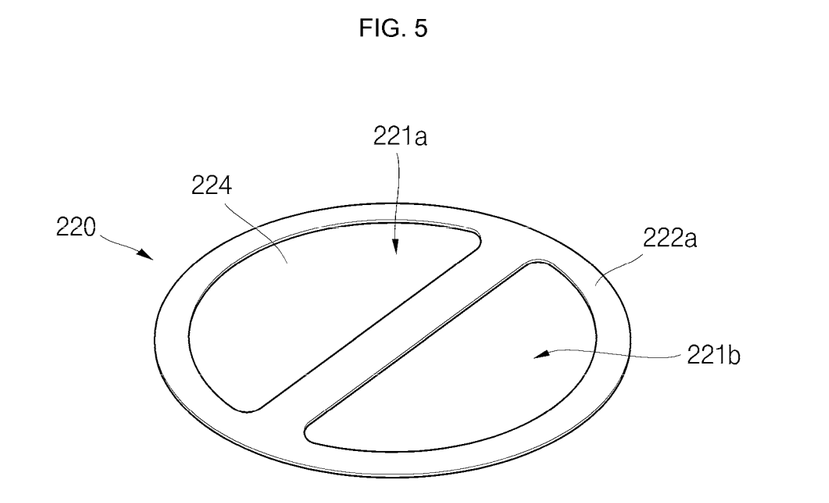
FIGS. 5 and 6 are perspective views of a second module of the secondary battery of FIG. 1.
Figure 6:
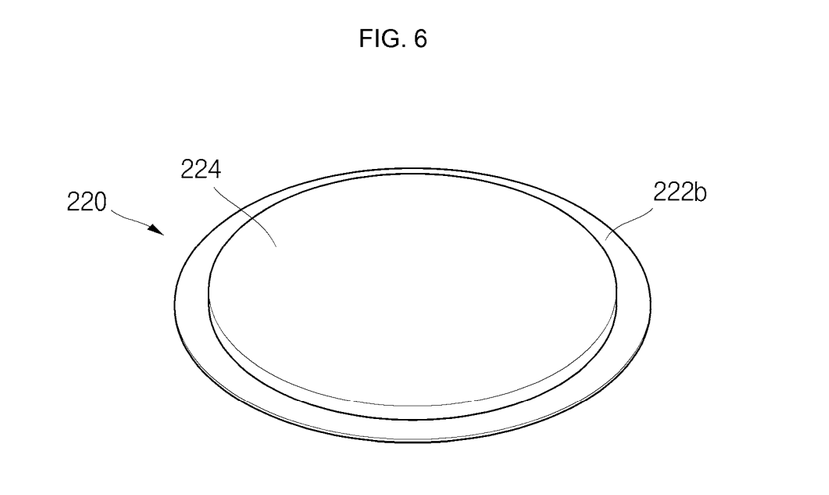

FIGS. 5 and 6 are perspective views of the second module 220. Referring to FIGS. 1, 2, 5, and 6, the second module 220 is located under the bottom end 122 of the bare cell 100, and includes a second board 222 and a second plate 224. The second board 212 is generally disk-shaped, and may be a flexible printed circuit board (FPCB). A plurality of printed circuit patterns (not shown) may be connected to the second plate 224 and a mounting portion 216 formed on the second board 222. Semicircular holes 221a and 221b are formed at a central portion of the second board 222. The second board 222 has an inner surface 222b that faces the bottom end 122 of the can 120, and an outer surface 222a that faces the bottom cap 320.

The second plate 224 is centrally located on the inner surface 222b of the second board 222. The second plate 224 is generally disk-shaped and may be flat. The bottom end 122 of the can 120 (second electrode terminal) is welded to the second plate 224.

The third module 230 is located along the length of the bare cell 100, on an outer surface of the can 120. The third module 230 is generally rectangular. The third module 230 electrically connects the first board 212 of the first module 210 and the second board 222 of the second module 220. The third module 230 may be a flexible printed circuit board (FPCB).

Figure 7:
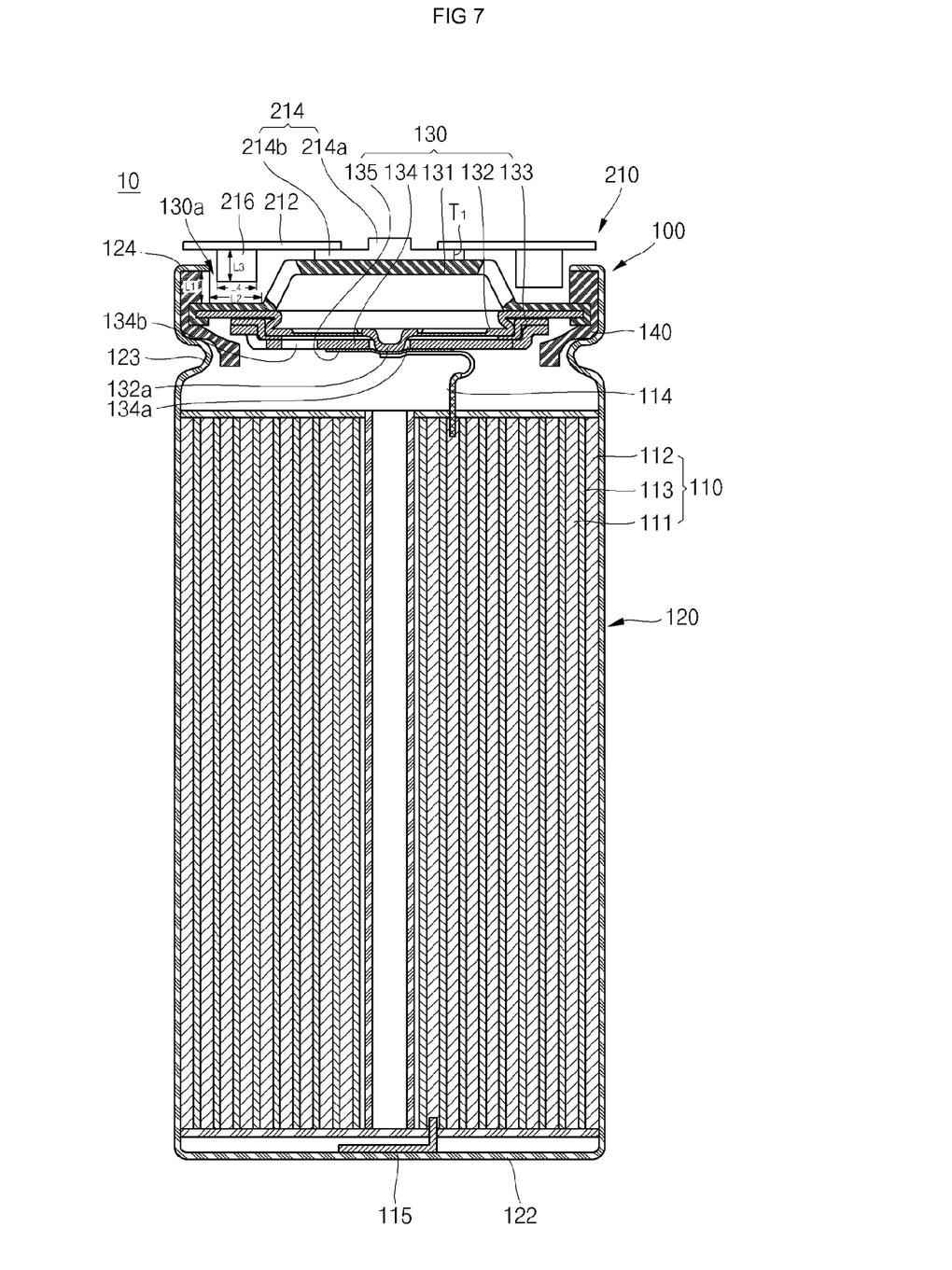
FIG. 7 is a sectional view of the secondary battery of FIG. 1, as partially assembled.

FIG. 7 is a sectional view of the bare cell 100 and the first module 210, as assembled. Referring to FIG. 7, the first module 210 is electrically connected to the first electrode terminal (cap-up 131) of the bare cell 100. More particularly, the first plate 214 of the first module 210 is electrically connected to the outer surface of the cap-up 131.

The groove 130a is formed between a side surface of the cap-up 131 and the gasket 140. When the first module 210 and the bare cell 100 are coupled to each other, the mounting portion 216 is located in the groove 130a.

The thickness L3 of the mounting portion 216 is smaller than the sum of the depth L1 of the groove 130a and the thickness T1 of the flat portion 214a of the first plate 214. The width L4 of the mounting portion 216 may be smaller than the width L2 of the groove 130a. Hence, when the mounting portion 216 is located in the groove 130a, the gasket 140 and the cap-up 131 may not be in contact with each other.

Since the mounting portion 216 is compactly located in the groove 130a, the secondary battery 10 can be miniaturized, as compared to a conventional battery, which includes a separate space that is occupied by a conventional mounting portion.

Since a secondary battery generally should include various components, its overall size can be reduced by modifying such components. Hence, as compared to a general battery, aspects of the present invention allow for the omission of a separate space for a conventional mounting portion, by locating the mounting portion in a groove between a cap-up and a can.

The groove 130a and the mounting portion 216 are spaced apart from each other. Hence, when an excessive internal pressure is generated in the bare cell 100, due to the gas generated in the electrode assembly 110, the gas can be discharged through the space between the groove 130a and the mounting portion 216. Therefore, the secondary battery 10 can be protected from excessive internal pressure and/or explosion.

Figure 8:
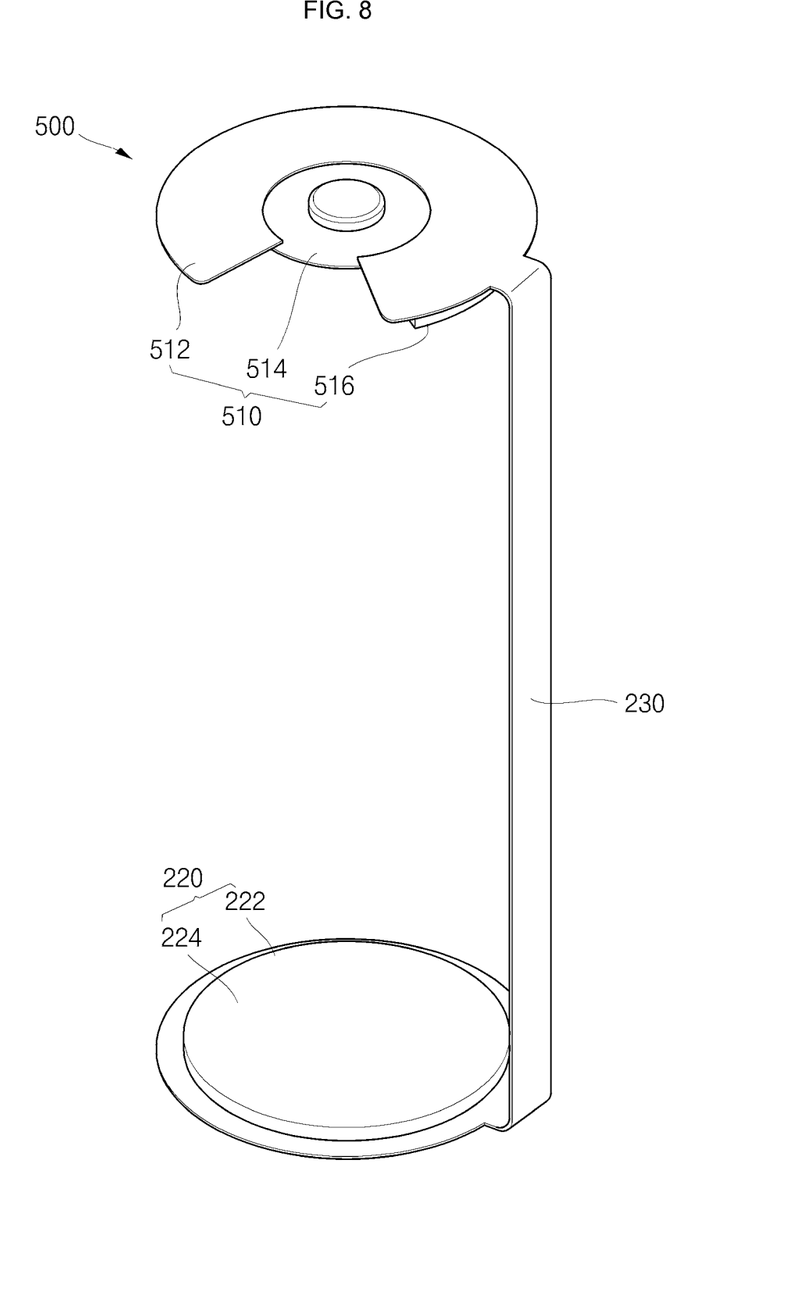
FIGS. 8 to 10 are perspective views of a protective circuit module, according to another exemplary embodiment of the present invention.
Figure 9:
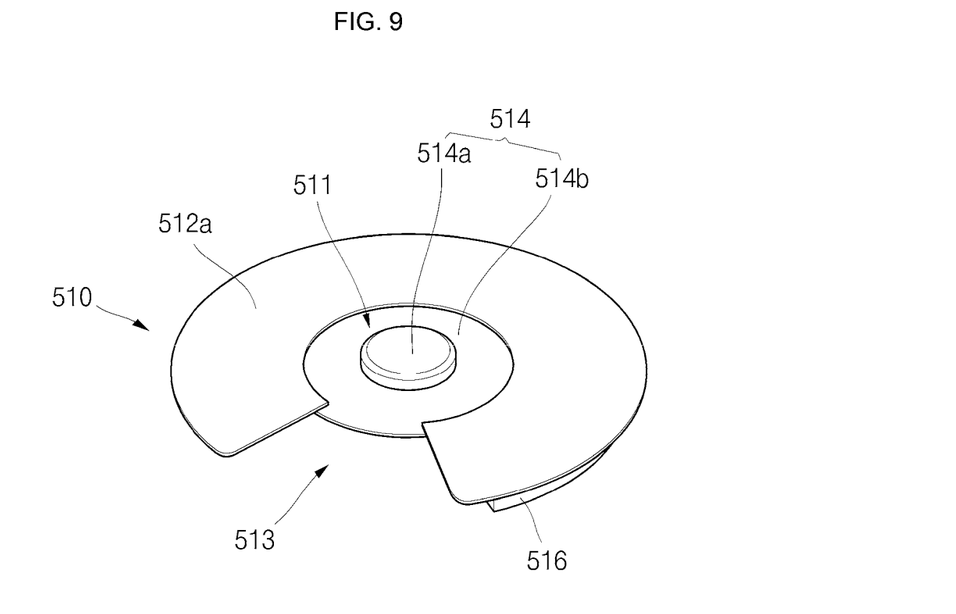
Figure 10:
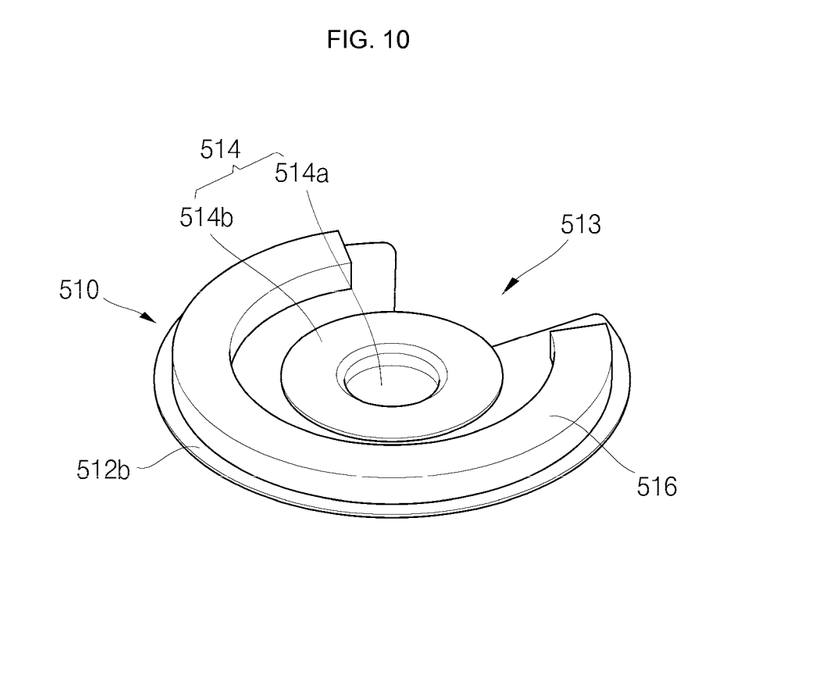

FIGS. 8-10 are perspective views of a protective circuit module 500, according to another exemplary embodiment of the present invention. Referring to FIGS. 2, and 8-10, the protective circuit module 500 includes a first module 510, a second module 220, and a third module 230 electrically connecting the first module 510 and the second module 220. The second and third modules 220, 230 are generally the same as described above, so only the first module 510 will be described in detail. The top cap 310 and the bottom cap 320 cover the outer surfaces of the first module 510 and the second module 220, respectively, and are connected to a bare cell 100, in the same manor as shown for the protective circuit module 200, in FIG. 1.

The first module 510 includes a first board 512, a first plate 514, and a mounting portion 516. The first board 512 is generally disk-shaped, and may be a flexible printed circuit board (FPCB). A plurality of printed circuit patterns (not shown) may be connected to the first plate 514 and the mounting portion 516. A circular hole 511 (through hole) is formed at a central portion of the first board 512. An opened portion 513 (opening) is formed in the first board 512. The opened portion 513 extends from the hole 511 to the outer edge of the first board 512. The opened portion 513 is generally sector-shaped, but lacks an apex. The first board 512 has an outer surface 512a and an inner surface 512b.

The first plate 514 is located at a central portion of the inner surface 512b. The first plate 514 includes a protrusion 514a that protrudes through the hole 511, and a flat portion 514b that is soldered to the inner surface 512b of the first board 512. The first electrode terminal (cap-up 131) is welded to the flat portion 514b of the first plate 514.

The mounting portion 516 is located at an outer edge of the inner surface 512b of the first board 512. A portion of the mounting portion 516 is removed, so as not to cover the opened portion 513, so the mounting portion 516 is substantially C-shaped. The mounting portion 516 is located on the inner surface 512b of the first board 512, and is spaced apart from the first plate 514. In the mounting portion 516, passive and active devices, including a protective circuit, are electrically connected to conductive metal patterns. The protective circuit checks the charge/discharge state, current, voltage, and/or temperature of the bare cell 100, to protect the bare cell 100.

Referring to FIGS. 2 and 8-10, the first module 510 is electrically connected to the first electrode terminal (cap-up 131). More particularly, the first plate 514 of the first module 510 is electrically connected to the top surface of the cap-up 131 of the bare cell 100.

When the first module 510 and the bare cell 100 are coupled to each other, the mounting portion 516 of the first module 510 is located in the groove 130a. Since the mounting portion 516 is located compactly in the groove 130a, the secondary battery 10 can be miniaturized, by excluding a conventional separate space for a conventional mounting portion.

The groove 130a and the mounting portion 516 are spaced apart from each other. The first board 512 includes an opened portion 513. Hence, when an excessive internal pressure is generated in the bare cell 100, due to the gas generated in the electrode assembly 110, the gas can be discharged through the opened portion 513, as well as through the space between the groove 130a and the mounting portion 516. Therefore, the bare cell 100 can be protected from excessive expansion and/or explosion.

Figure 11:
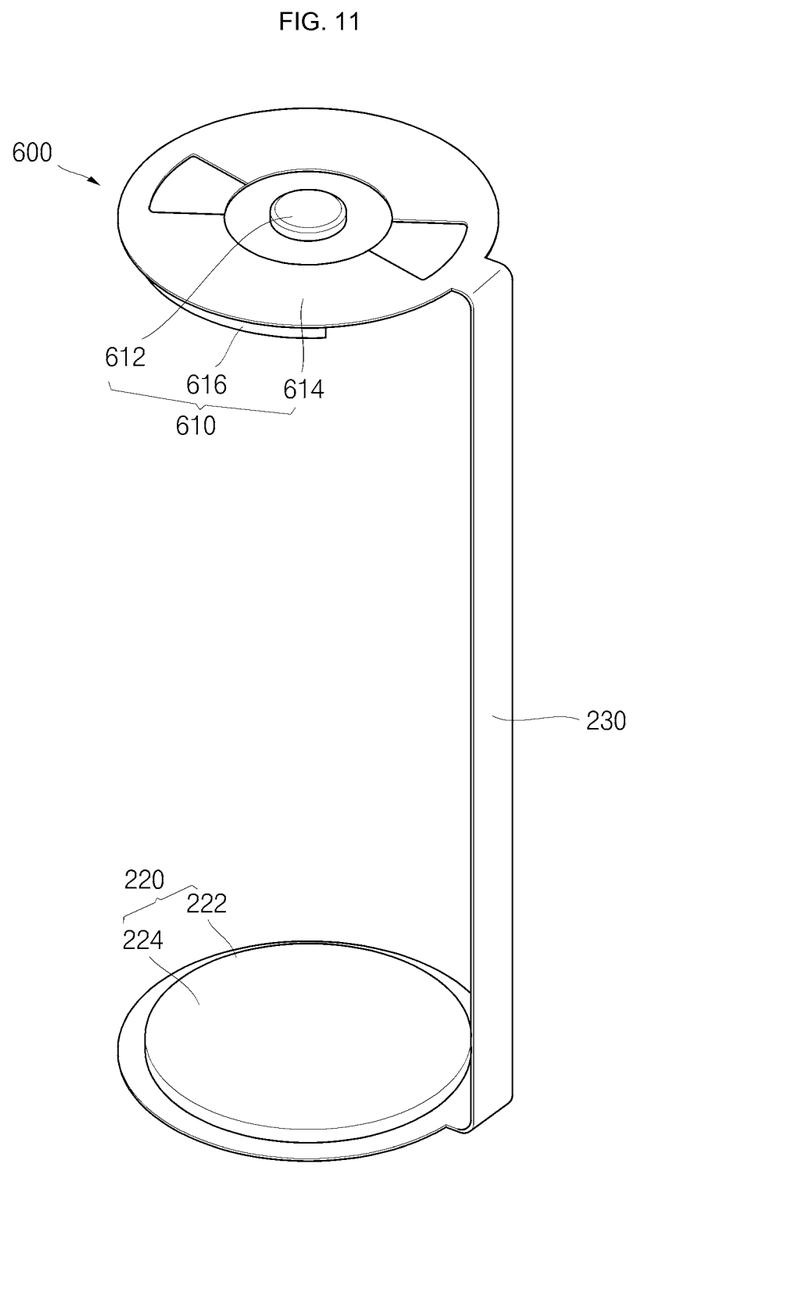
FIGS. 11 to 13 are perspective views of a protective circuit module, according to still another exemplary embodiment of the present invention.
Figure 12:
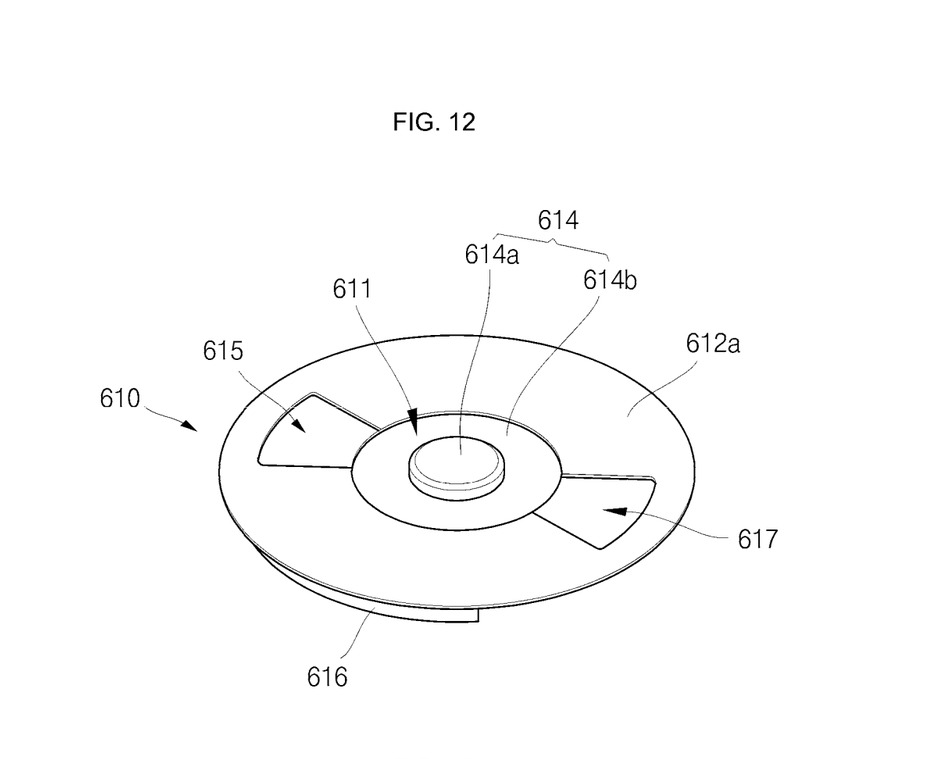
Figure 13:
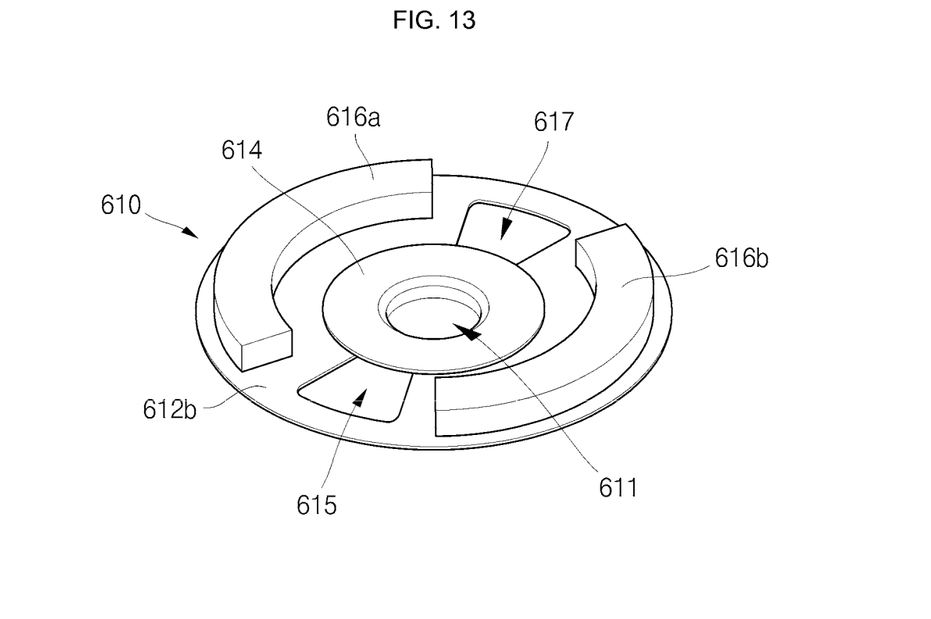

FIGS. 11 to 13 are perspective views of a protective circuit module 600, according to still another exemplary embodiment of the present invention. Referring to FIGS. 11-13, the protective circuit module 600 includes a first module 610, a second module 220, and a third module 230 electrically connecting the first module 610 and the second module 220 to each other. The second and third modules 220, 230 are generally the same as described above, so only the first module 610 will be described in detail. The top cap 310 and the bottom cap 320 cover the outer surfaces of the first module 610 and the second module 220, respectively, and are connected to a bare cell 100, in the same manor as shown for the protective circuit module 200, in FIG. 1.

The first module 610 is located on the top surface of the bare cell 100 (see FIG. 2) and includes a first board 612, a first plate 614, and a mounting portion 616. The first board 612 is generally disk-shaped, and may be a flexible printed circuit board (FPCB). A plurality of printed circuit patterns (not shown) may be connected to the first plate 614 and the mounting portion 616. A circular hole 611 (through hole) is formed at a central portion of the first board 612.

A first opened portion 615 (through hole) and a second opened portion 617 (through hole) are formed in the first board 612. The first and second opened portions 615, 617 extend from the hole 611 toward the outer edge of the first board 612. The first and second opened portions 615, 617 are shown as being symmetrically disposed around the hole 611, but they may be asymmetrically disposed, according to other exemplary embodiments. The first and second opened portions 615 and 617 can be sector-shaped, but lack apexes. The first board 612 has an outer surface 612a and an inner surface 612b.

The first plate 614 is located at a central portion of the inner surface 612b of the first board 612. The first plate 614 includes a protrusion 614a protruding through the hole 611 of the first board 612, and a flat portion 614b soldered to the inner surface 612b of the first board 612. The first electrode terminal (the cap-up 131) is welded to the flat portion 614b of the first plate 614.

The mounting portion 616 is located at the outer edge of the inner surface 612b of the first board 612. The mounting portion 616 includes first and second C-shaped portions 616a, 616b, which are disposed so as not to cover the first and second opened portions 615, 617. The mounting portion 616 is located on the inner surface 612b of the first board 612, and is spaced apart from the first plate 614. In the mounting portion 616, passive and active devices, including a protective circuit, are electrically connected to conductive metal patterns. The protective circuit checks the charge/discharge state, current, voltage, and/or temperature of the bare cell 100, to protect the bare cell 100.

When the first module 610 and the bare cell 100 are coupled to each other, the mounting portion 616 is located in the groove 130a. Since the mounting portion 616 is located compactly in the groove 130a, the secondary battery 10 can be miniaturized, by excluding a conventional separate space for a mounting portion.

The groove 130a and the mounting portion 616 are spaced apart from each other. The first board 612 includes the first and second opened portions 615, 617. Hence, when an excessive internal pressure is generated in the bare cell 100, due to the gas generated in the electrode assembly 110, the gas can be discharged through the space between the groove 130a and the mounting portion 516, and through the first and second opened portions 615, 617. Therefore, the bare cell 100 can be protected from excessive expansion and/or explosion.

Although a few exemplary embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A secondary battery comprising:
   a bare cell comprising first and second electrode terminals; and
   a protective circuit module comprising:
      a disk-shaped first module electrically connected to the first electrode terminal;
      a disk-shaped second module electrically connected to the second electrode terminal; and
      a third module electrically connected to the first module and the second module,
   wherein the first module comprises:
      a first board comprising an inner surface facing the bare cell and an outer surface facing away from the bare cell, wherein the inner surface and the outer surface comprise opposing major surfaces of the first board;
      a first plate disposed on the inner surface at a central area of the first board, wherein the inner surface faces the first electrode terminal; and
      a mounting portion comprising a housing structure that is disposed on the inner surface at a peripheral area of the first board, the housing structure defining a space for enclosing circuitry of the protective circuit module therein, wherein the mounting portion is spaced apart from and around the first plate,
   wherein the mounting portion is disposed inside a groove formed between the first electrode terminal and a can of the bare cell, and wherein the mounting portion is spaced apart from the bare cell.

2. The secondary battery of claim 1, wherein the second module comprises: a second board; and a second plate disposed on an inner surface of the second board, which faces the second electrode terminal.

3. The secondary battery of claim 1, wherein the mounting portion is annular.

4. The secondary battery of claim 1, wherein the first board has a hole to expose the first plate.

5. The secondary battery of claim 2, wherein the second board has a hole to expose the second plate.

6. The secondary battery of claim 4, wherein the first electrode terminal is welded to the first plate, via the hole.

7. The secondary battery of claim 5, wherein the second electrode terminal is welded to the second plate, via the hole.

8. The secondary battery of claim 1, wherein the third module is a flexible printed circuit board (FPCB).

9. The secondary battery of claim 1, wherein the first board is a flexible printed circuit board (FPCB).

10. The secondary battery of claim 2, wherein the second board is a flexible printed circuit board (FPCB).

11. The secondary battery of claim 1, further comprising a label surrounding the bare cell.

12. The secondary battery of claim 1, further comprising a top cap to cover the first module.

13. The secondary battery of claim 1, further comprising a bottom cap to cover the second module.

14. The secondary battery of claim 1, wherein the first board has an opening.

\* \* \* \* \*